United States Patent
Hodges et al.

(10) Patent No.: US 12,376,228 B2
(45) Date of Patent: Jul. 29, 2025

(54) ELECTRONIC PROTOTYPING

(71) Applicant: Microsoft Technology Licensing, LLC, Redmond, WA (US)

(72) Inventors: Stephen Edward Hodges, Cambridge (GB); Michal J. Moskal, Seattle, WA (US); Gabriele D'Amone, Cambridge (GB); James Alexander Devine, Cambridge (GB); Jonathan Paul De Halleux, Seattle, WA (US); Thomas Jaudon Ball, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 357 days.

(21) Appl. No.: 17/852,698

(22) Filed: Jun. 29, 2022

(65) Prior Publication Data
US 2024/0008174 A1  Jan. 4, 2024

(51) Int. Cl.
 *H05K 1/02* (2006.01)
 *H05K 1/11* (2006.01)

(52) U.S. Cl.
 CPC ......... *H05K 1/0292* (2013.01); *H05K 1/0293* (2013.01); *H05K 1/117* (2013.01); *H05K 2201/09027* (2013.01); *H05K 2201/09127* (2013.01); *H05K 2201/09163* (2013.01); *H05K 2201/09236* (2013.01); *H05K 2201/09245* (2013.01)

(58) Field of Classification Search
 CPC .................................................. H05K 1/0292
 USPC ....................................................... 174/177
 See application file for complete search history.

(56) References Cited

U.S. PATENT DOCUMENTS

| | | | |
|---|---|---|---|
| 8,488,332 B2 | 7/2013 | Eguchi | |
| 8,708,323 B2 | 4/2014 | Hoyt | |
| 10,535,938 B2 | 1/2020 | Sherman | |
| 10,603,750 B1 | 3/2020 | Taylor | |
| 2013/0102937 A1* | 4/2013 | Ehrenreich | A61H 23/0236 601/47 |
| 2017/0194721 A1* | 7/2017 | Fan | H01R 12/57 |

(Continued)

FOREIGN PATENT DOCUMENTS

RU  2631122 C1  9/2017

OTHER PUBLICATIONS

"25 Pairs 3.0MM Bullet Banana Plug Male & Female Connectors RC Model Parts for ESC Motor Lipo Battery Gold-plated", Retrieved from: https://www.amazon.co.uk/gp/product/B094N5FF2T/ref=ppx_yo_dt_b_asin_image_007_s00?th=1, May 11, 2021, 2 Pages.

(Continued)

*Primary Examiner* — Stanley Tso
(74) *Attorney, Agent, or Firm* — Rainier Patents, P.S.

(57) ABSTRACT

The description relates to prototyping systems, including hubs for electrically connecting devices. One example can include an electrically insulative substrate and at least two connector tabs defined by the substrate, each connector tab including a data contact, a power contact, and a ground contact positioned over the substrate. A data bus can be positioned relative to the substrate and electrically connect all of the data contacts, a power bus can be positioned relative to the substrate and electrically connect all of the power contacts, and a ground bus can be positioned relative to the substrate and electrically connect all of the ground contacts.

20 Claims, 8 Drawing Sheets

(56) References Cited

U.S. PATENT DOCUMENTS

| | | | |
|---|---|---|---|
| 2018/0126175 A1 | 5/2018 | Seitz | |
| 2020/0052450 A1* | 2/2020 | Sugiyama | H01R 12/716 |
| 2020/0300598 A1* | 9/2020 | Kim | G01L 5/0052 |
| 2020/0335432 A1 | 10/2020 | Murtagian | |
| 2021/0037684 A1* | 2/2021 | Kwak | H01Q 1/243 |
| 2021/0270431 A1* | 9/2021 | John | F21S 4/28 |
| 2022/0200212 A1 | 6/2022 | Yi | |
| 2022/0260805 A1 | 8/2022 | Ready | |
| 2023/0389175 A1 | 11/2023 | Hodges | |
| 2024/0006833 A1 | 1/2024 | Hodges | |

OTHER PUBLICATIONS

"Copper Alloy Push Pins with Compression Springs", Retrieved from: https://web.archive.org/web/20201031175434/http://www.rego.com.tw/product_detail.php?prdt_id=247, Oct. 31, 2020, 2 Pages.

"Jacdac", Retrieved from: https://web.archive.org/web/20220317005444/https://microsoft.github.io/jacdac-docs/, Mar. 17, 2022, 8 Pages.

Lambrichts, et al., "A Survey and Taxonomy of Electronics Toolkits for Interactive and Ubiquitous Device Prototyping", In Proceedings of the ACM on Interactive, Mobile, Wearable and Ubiquitous Technologies, vol. 5, Issue 2, Jun. 2021, 24 Pages.

Ex Parte Quayle Action mailed on Jun. 17, 2024, in U.S. Appl. No. 17/849,305, 07 pages.

Notice of Allowance mailed on Aug. 9, 2024, in U.S. Appl. No. 17/849,305, 10 pages.

U.S. Appl. No. 17/852,726, filed Jun. 29, 2022.

U.S. Appl. No. 17/849,305, filed Jul. 24, 2022.

Notice of Allowance mailed on Sep. 4, 2024, in U.S. Appl. No. 17/849,305, 8 pages.

Notice of Allowance mailed on Nov. 4, 2024, in U.S. Appl. No. 17/849,305, 8 pages.

Notice of Allowance mailed on Jan. 15, 2025, in U.S. Appl. No. 17/852,726, 9 pages.

* cited by examiner

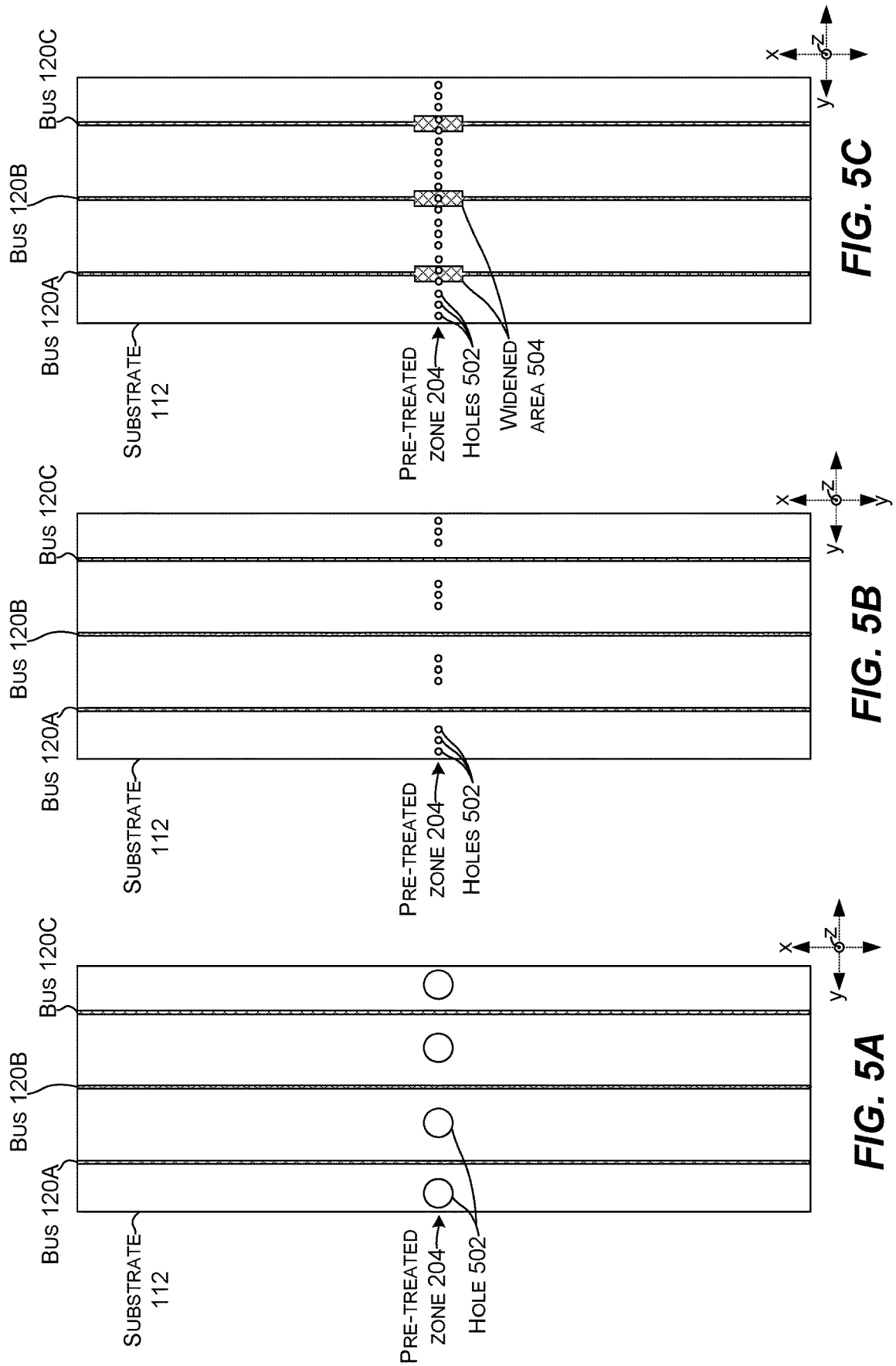

ELECTRONIC PROTOTYPING

BACKGROUND

In the electronic device realm, many ideas may be tested before a successful solution is identified. Electronic prototyping platforms are designed to support quick exploration and iteration of the numerous ideas.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

FIGS. 1A-1C, 2A-2C, 3A, 3B, 4A, 4B, and 5A-5C show elevational views of example devices in accordance with some implementations of the present concepts.

DESCRIPTION

The present concepts relate to modular electronics prototyping systems or platforms. Electronics prototyping platforms are designed to support quick exploration and iteration of ideas, typically resulting in an artefact that runs on the bench to demonstrate aspects of the operation of a device configuration. However, existing prototyping platforms tend to include designs that limit the user's options when configuring exploratory circuit configurations. The present concepts offer a technical solution to these and/or other technical problems.

Figure 1A:
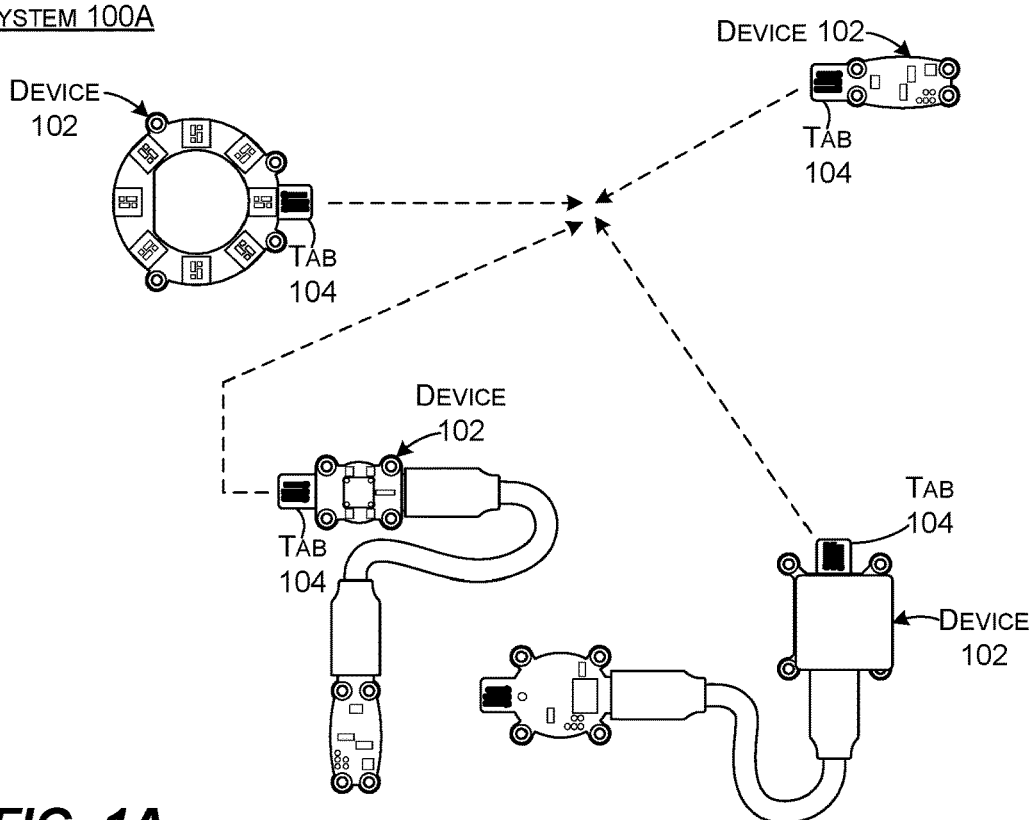
Figure 1B:
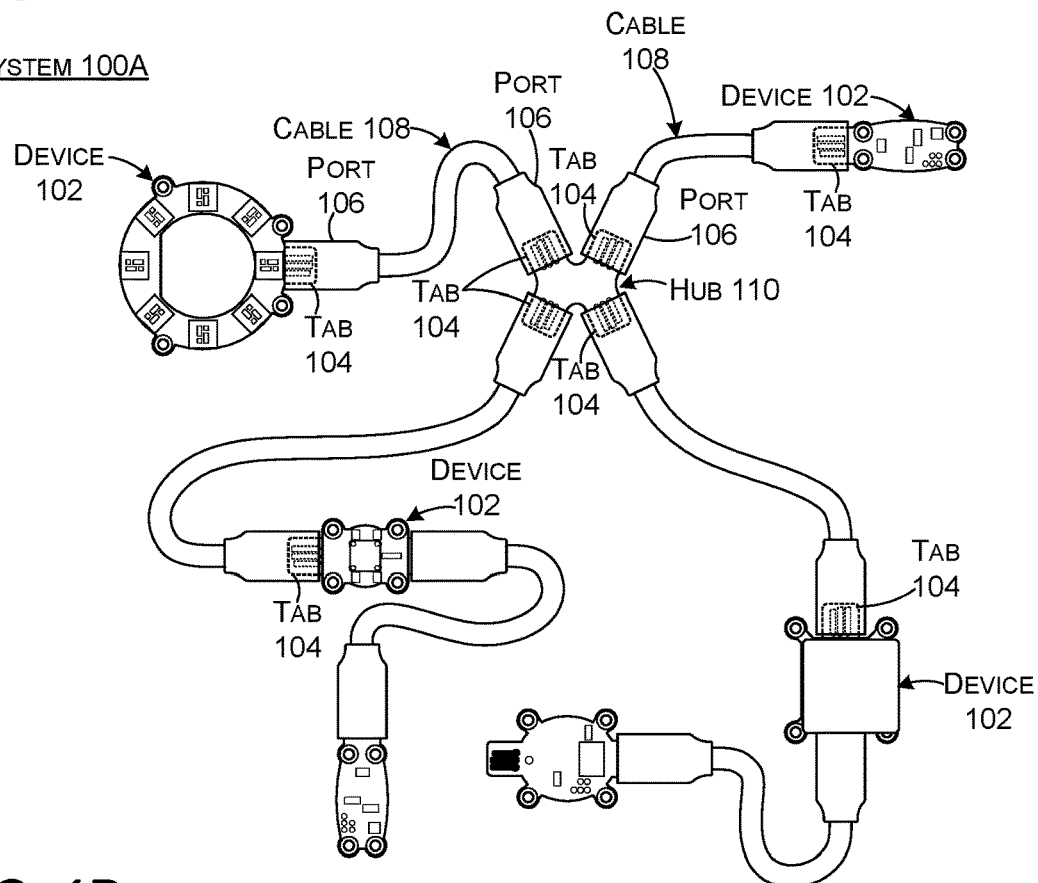
Figure 1C:
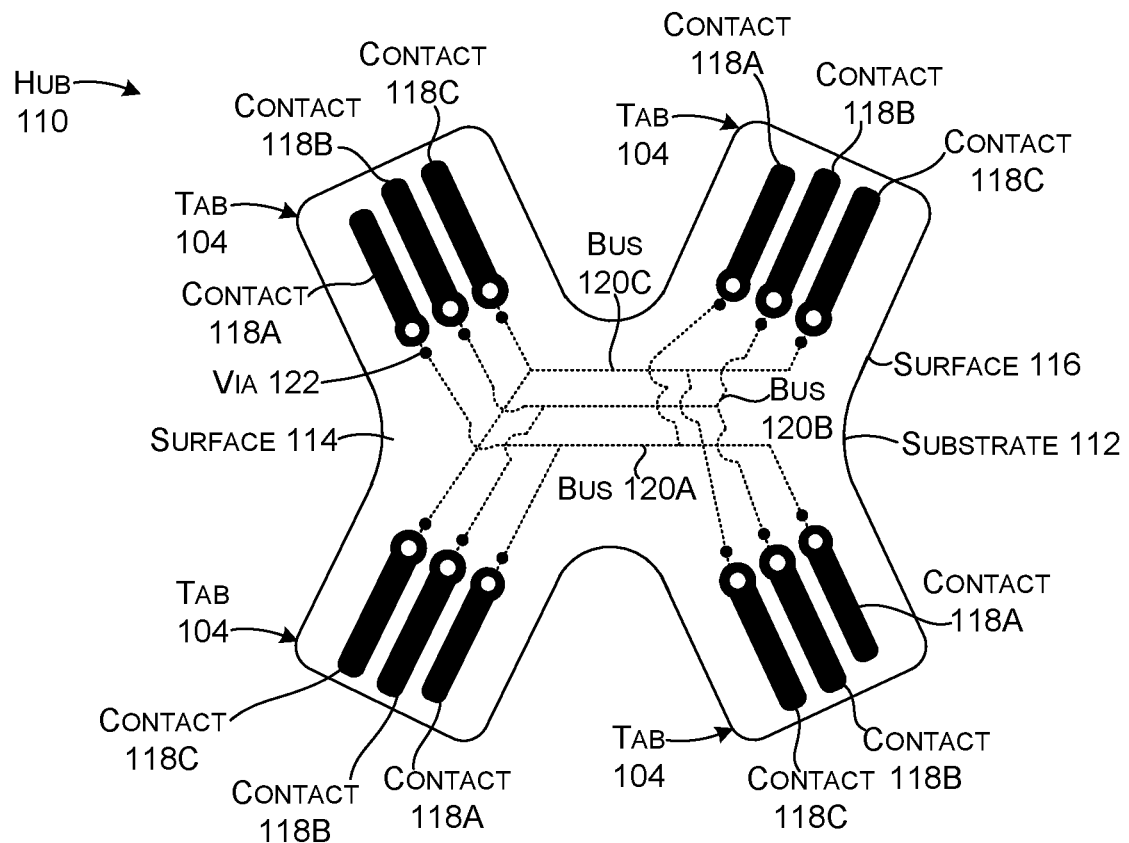
Figure 1C:
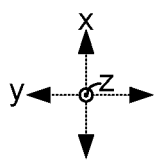

FIGS. 1A-1C collectively show an example system 100A that is consistent with various prototyping platforms, such as the Jacdac brand prototyping platform. The system can include devices 102 that the user wants to electrically interconnect. The devices 102 can include edge connector tabs (hereinafter, "tabs") 104 that can receive ports 106 on connector cables 108 to connect two devices. (Not all ports 106 and cables 108 are labelled). However, the devices 102 may not include enough tabs 104 to allow the devices to be interconnected in a configuration desired by a user. This technical problem can be solved via one or more hubs 110. The hubs 110 can have multiple tabs 104 to allow multiple devices to be interconnected. In this illustrated configuration, the hub 110 has four connector tabs 104. Other hubs 110 can have many more tabs as will be illustrated and described below.

FIG. 1C shows example hub 110 in more detail. In this case, the hub can include an electrically insulative substrate 112 that defines opposing major surfaces 114 and 116 that lie generally parallel (such as +/−10 degrees) to the xy reference plane and are separated by a thickness in the z reference direction. Major surface 114 is facing toward the reader and major surface 116 is facing away from the reader and as such is not directly visible. The electrically insulative substrate 112 can be formed from various materials, such as polymers and/or composites, for example. The electrically insulative substrate 112 can be monolithic or include various layers.

Tabs 104 can include three exposed electrically conductive contacts 118. In this case, contact 118A is a data contact, contact 118B is a ground contact, and contact 118C is a power contact. Contact 118A is connected to a data bus 120A, contact 118B is connected to a ground bus 120B, and contact 118C is connected to a power bus 120C. Note that buses 120 are illustrated in ghost to indicate that they would likely not be visible in this view. For instance, they could be located within the substrate 112 and/or positioned on top of the substrate and covered with a protective insulative layer, among other configurations. This configuration allows all contacts 118A to be connected via bus 120A and electrically insulated from the other contacts (118B and 118C), contacts 118B are connected via bus 120B and electrically insulated from the other contacts (118A and 118C), and contacts 118C are connected via bus 120C and electrically insulated from the other contacts (118A and 118B).

Note that contacts 118 can be positioned on a single side of the substrate 112 (e.g., either major surface 114 or major surface 116). Alternatively, the contacts 118 can be positioned on both sides (e.g., on both major surfaces 114 and 116) of the tabs 104. In this implementation, vias 122 allow conductors to extend through the substrate to electrically connect the contacts 118 on the opposing major surfaces 114 and 116. In some implementations, the vias 122 can be configured in the substrate so that the contacts 118 have the same layout regardless of which surface is up. This configuration can eliminate the need for the user to figure out the proper orientation between the cable (e.g., the port) and the tab. For instance, if the contacts on surface 114 are laid out from left to right as data, ground, power, when the hub is flipped over to surface 116, the layout remains the same (e.g., data, ground, power from left to right). As such, when the port is physically aligned with the tab the conductors of the port are automatically aligned with the corresponding contacts on the tab (e.g., effectively the port cannot accidentally be upside down).

Note that the present hub concepts offer hub implementations where the hub 110 can be separated, if desired by the user, into multiple different hubs that are all functional. For instance, relative to FIG. 1C, hub 110 can be separated along axes that are parallel to the x reference axis to create two hubs that have two tabs each. These aspects are discussed below relative to FIGS. 2A-2C.

Figure 2A:
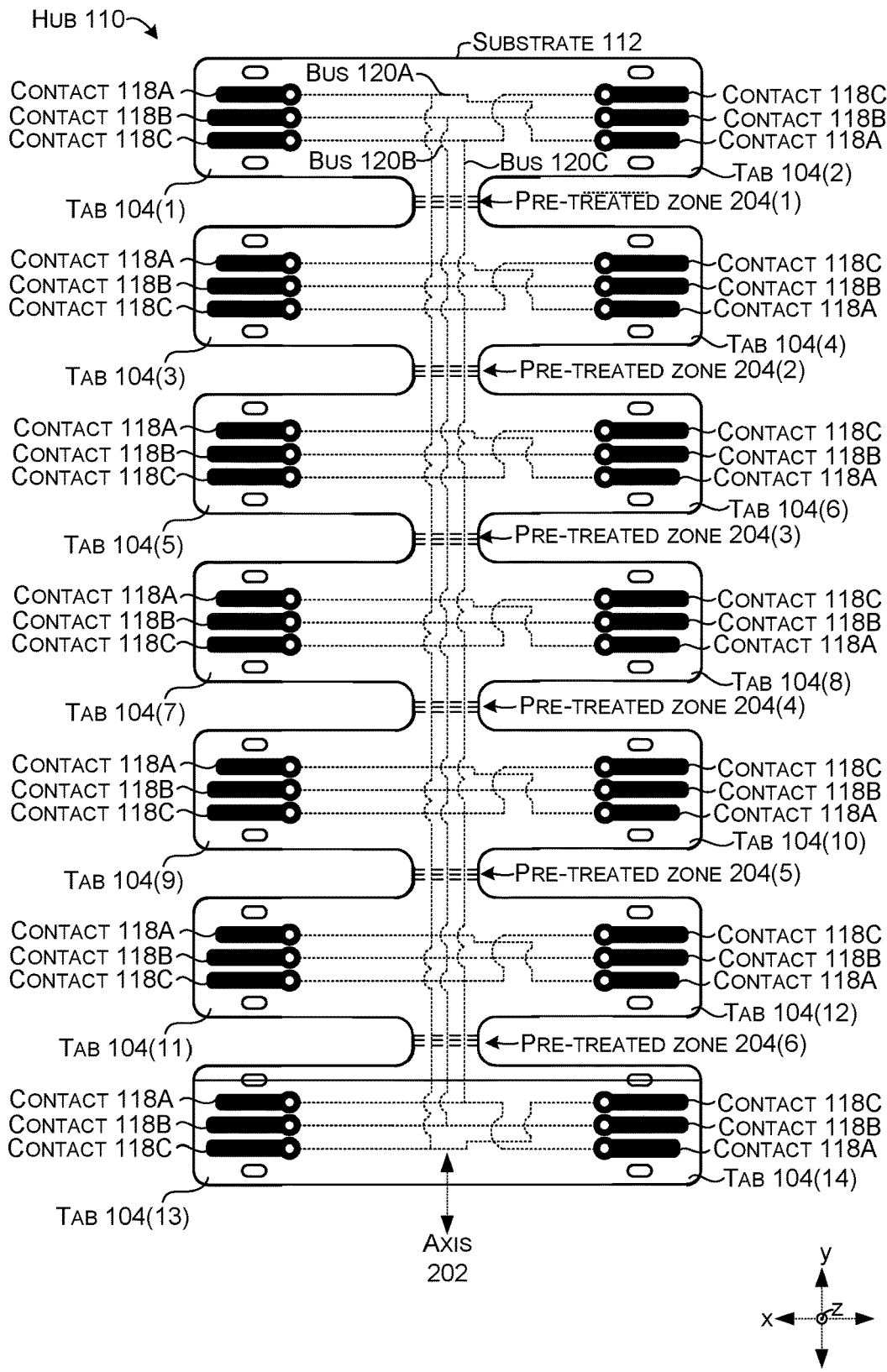
Figure 2B:
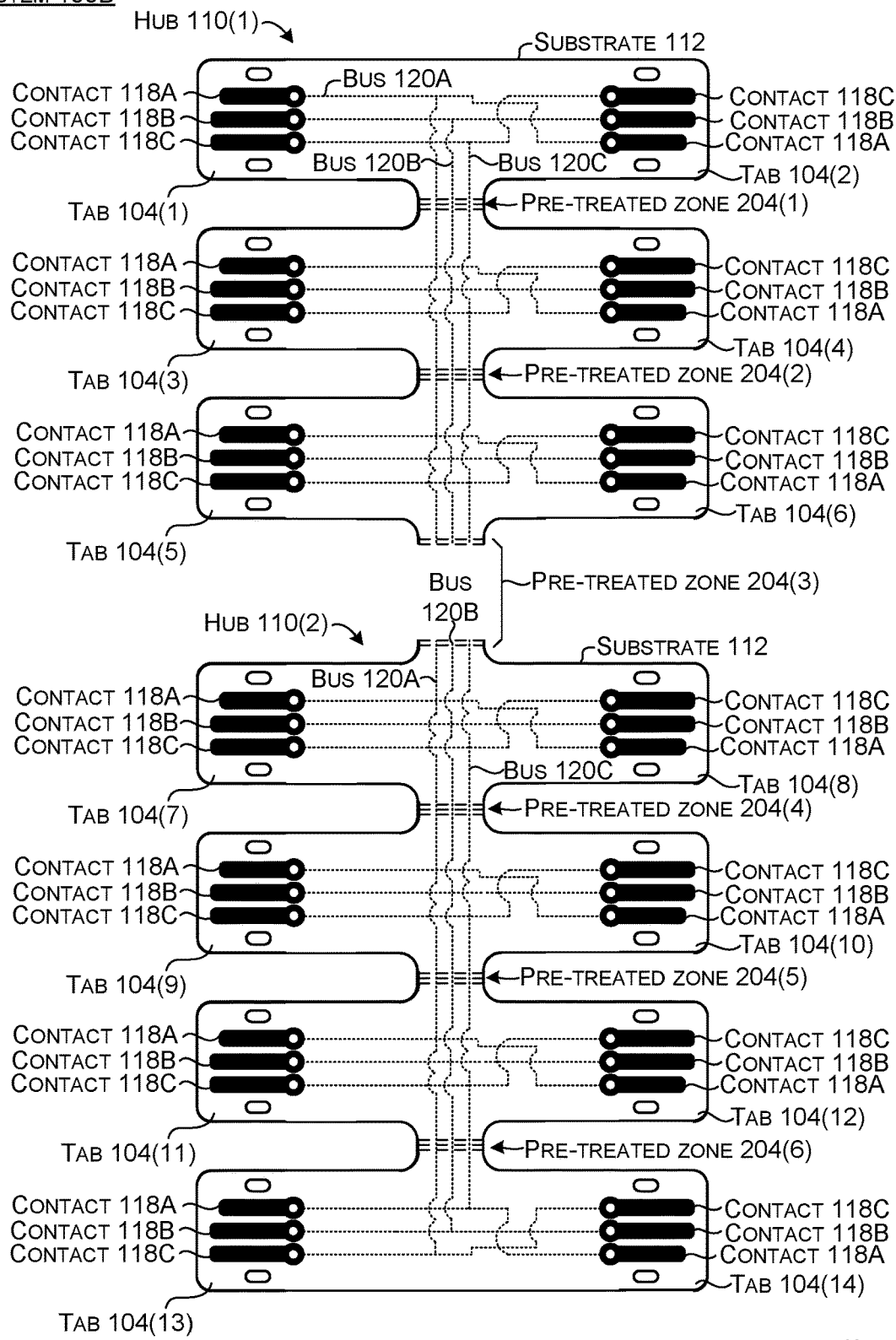
Figure 2B:
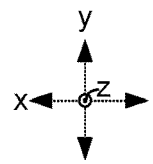
Figure 2C:
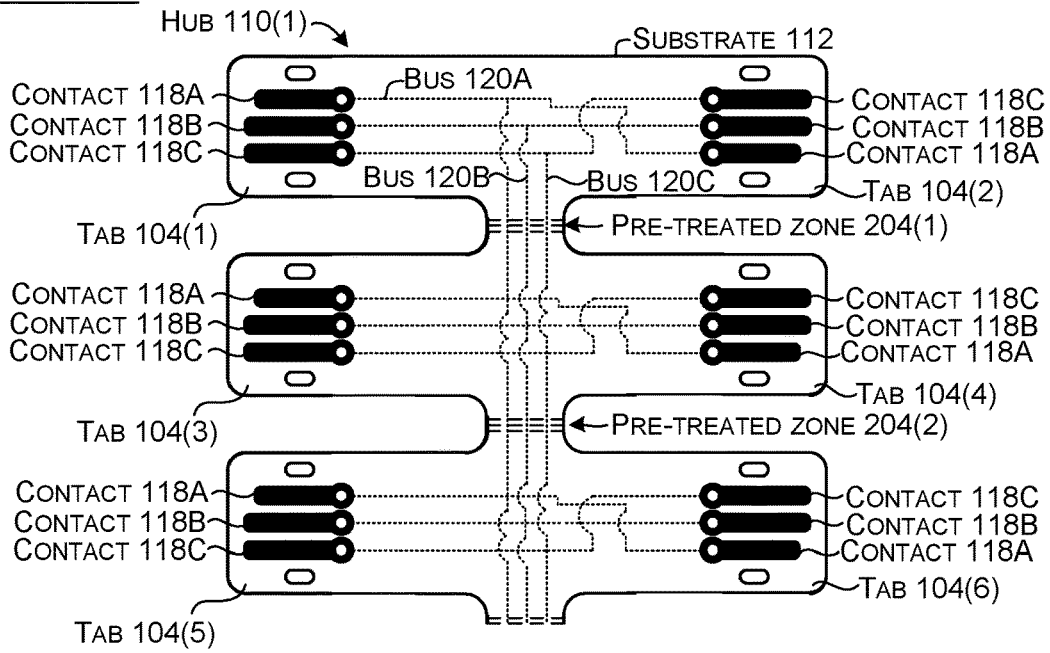
Figure 2C:
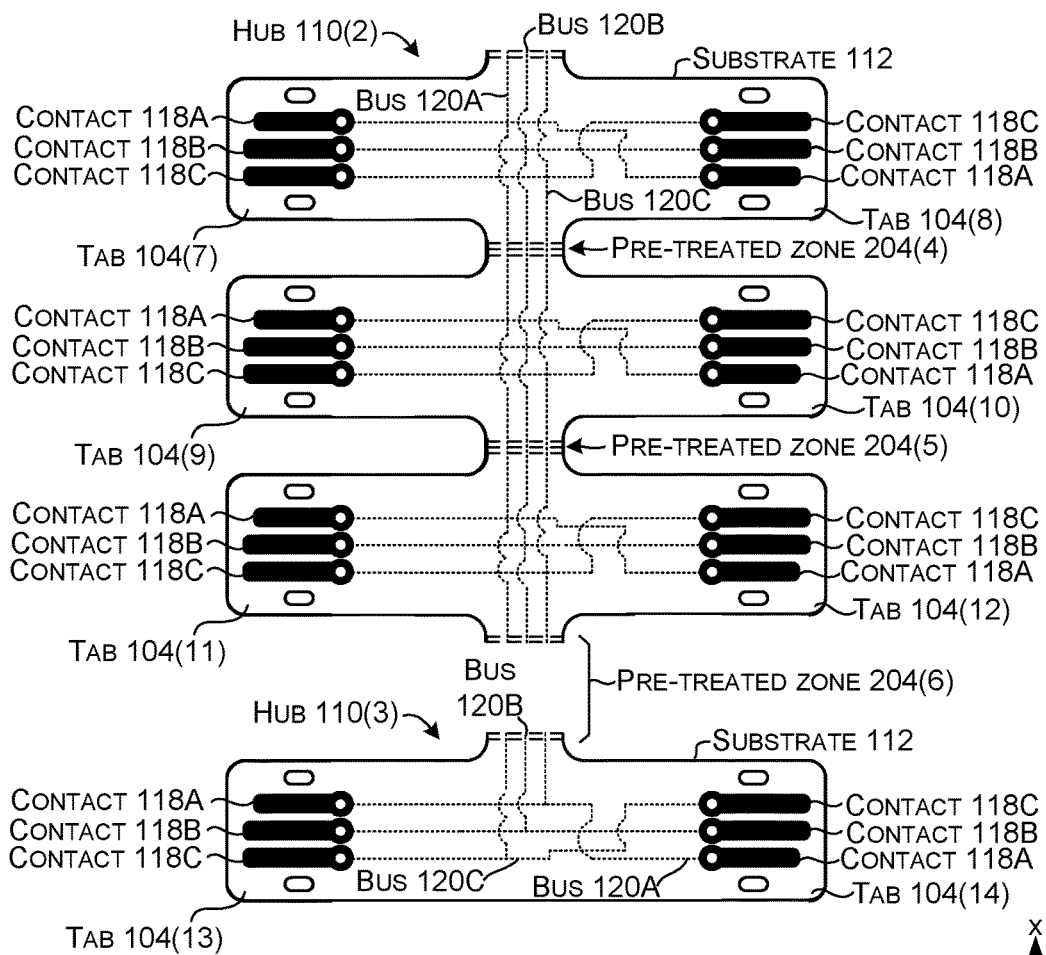
Figure 2C:
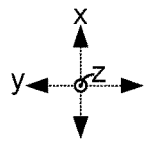

FIGS. 2A-2C collectively illustrate another example system 100B. As used here, the suffix "B" indicates that this system may be different from system 100A described above and/or from systems described below. For instance, the system may include different components and/or individual components may have differences from similar components in other systems.

In this case, as shown in FIG. 2A, hub 110 includes 14 tabs 104. Thus, 14 different devices could be coupled together with 14 conductor cables via hub 110. In this implementation, the tabs 104 are arranged linearly in pairs that are positioned on opposing sides along an axis 202 that is parallel to the x reference axis. The illustrated configuration employs seven pairs of tabs (e.g., odd suffixes 104(1), 104(3) etc. on the left side of the drawing page and even suffixes 104(2), 104(4) etc. on the right side of the drawing page). Thus, the axis 202 can define the substrate associated with each tab, such as tab 104(1) and 104(2). In this case, the axis bisects the individual tabs of each pair into identical amounts of substrate per tab. Other configurations are contemplated.

The illustrated hub configuration also offers a technical solution of user configurability for their hub desires/requirements. This technical solution is enabled by pre-treated zones 204 between adjacent pairs of tabs 104. For instance, in this case, pre-treated zone 204(1) is located between a first pair of tabs 104(1) and 104(2) and a second pair of tabs 104(3) and 104(4). Similarly, pre-treated zone 204(2) is located between the second pair of tabs 104(3) and 104(4) and a third pair of tabs 104(5) and 104(6) and pre-treated zone 204(3) is located between the third pair of tabs 104(5) and 104(6) and a fourth pair of tabs 104(7) and 104(8), etc. In the illustrated configuration, the pre-treated zones 204 are oriented orthogonally to the axis 202. Other orientations are contemplated.

The pre-treated zones 204 are configured to allow the user to separate pairs of tabs 104 as desired without damaging the structural integrity of the substrate 112 relating to the individual pairs and without damaging the electrical integrity of the buses 120 (e.g., without causing a short). For instance, the user may desire two smaller hubs rather than one larger hub. The present concepts can provide a technical solution to this problem. An example of the result of the user process is shown in FIG. 2B.

FIG. 2B shows system 100B with the substrate 112 and buses 120 physically separated at what had been pre-treated zone 204(3) in a direction parallel to the y reference axis to form two new and distinct hubs 110(1) and 110(2). Each of the two hubs 110(1) and 110(2) are now fully functional. On hub 110(1) all data contacts 118A are electrically coupled to data bus 120A, all ground contacts 118B are electrically coupled to ground bus 120B, and all power contacts 118C are electrically coupled to power bus 120C. Thus, hub 110(1) provides six tabs 104(1)-104(6) for the user to interconnect devices as desired. Similarly, on hub 110(2) all data contacts 118A are electrically coupled to data bus 120A, all ground contacts 118B are electrically coupled to ground bus 120B, and all power contacts 118C are electrically coupled to power bus 120C. Hub 110(2) provides eight tabs 104(7)-104(14) for the user to interconnect devices as desired.

FIG. 2C shows further flexibility offered by system 100B if the user desires another separate hub. In this example the user has broken the substrate 112 at pre-treated zone 204(6) to separate one pair of tabs 104(13) and 104(14) as hub 110(3) from hub 110(2). Hub 110(2) now includes tabs 104(7)-104(12). Within hub 110(2) all data contacts 118A are electrically interconnected by data bus 120A and electrically isolated/insulated from contacts 118B and 118C, all ground contacts 118B are electrically interconnected by ground bus 120B and electrically isolated from contacts 118A and 118C, and all power contacts 118C are electrically interconnected by power bus 120C and electrically isolated from contacts 118A and 118B.

Hub 110(3) includes tabs 104(13) and 104(14). Within hub 110(3) all data contacts 118A are electrically interconnected by data bus 120A and electrically isolated from contacts 118B and 118C, all ground contacts 118B are electrically interconnected by ground bus 120B and electrically isolated from contacts 118A and 118C, and all power contacts 118C are electrically interconnected by power bus 120C and electrically isolated from contacts 118A and 118B. Stated another way, while tabs 104(13) and 104(14) have been physically and electrically separated from the other tabs, physical and electrical connections are maintained between this pair of tabs (e.g., intra-pair data connectivity, ground connectivity, and/or power connectivity is maintained).

The user can now use the three hubs 110(1)-110(3) as desired, such as to construct different connections within a circuit of devices within a system and/or to construct multiple different circuits of devices in multiple different systems.

Figure 3A:
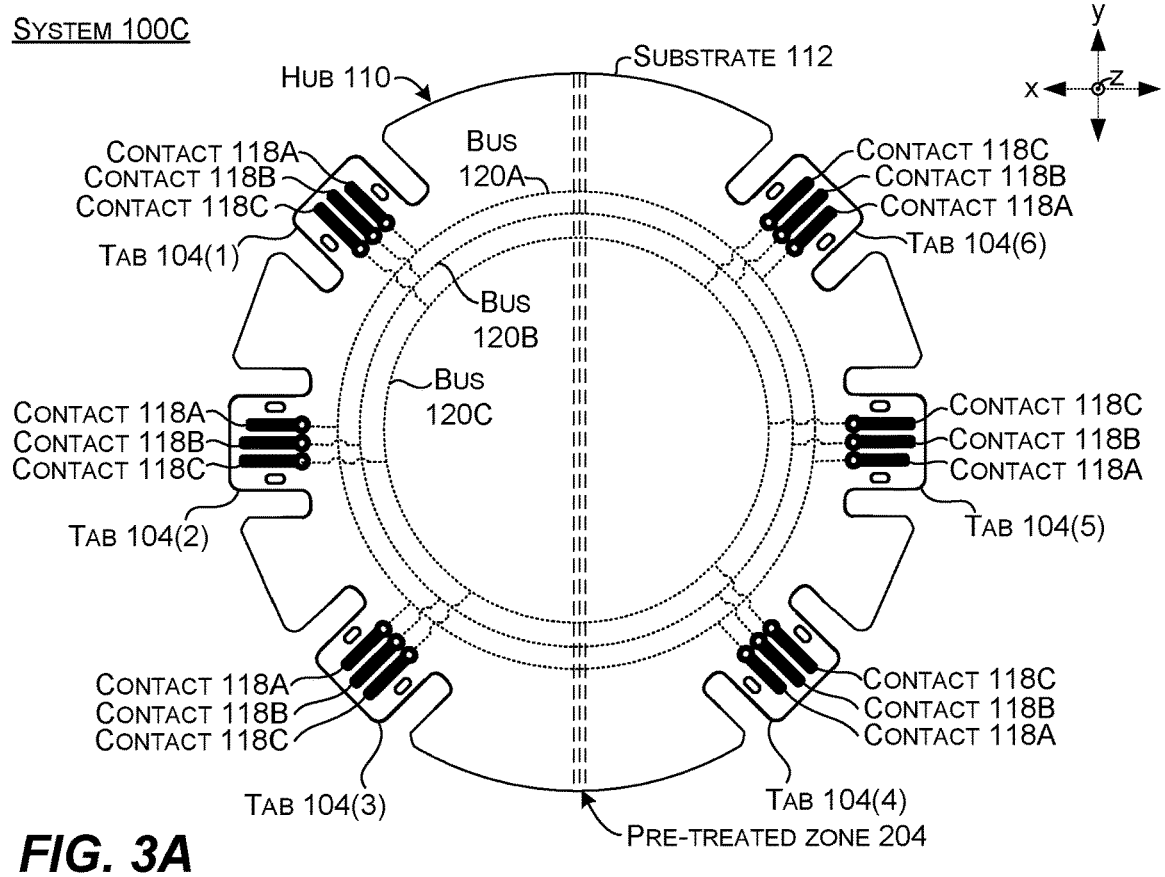
Figure 3B:
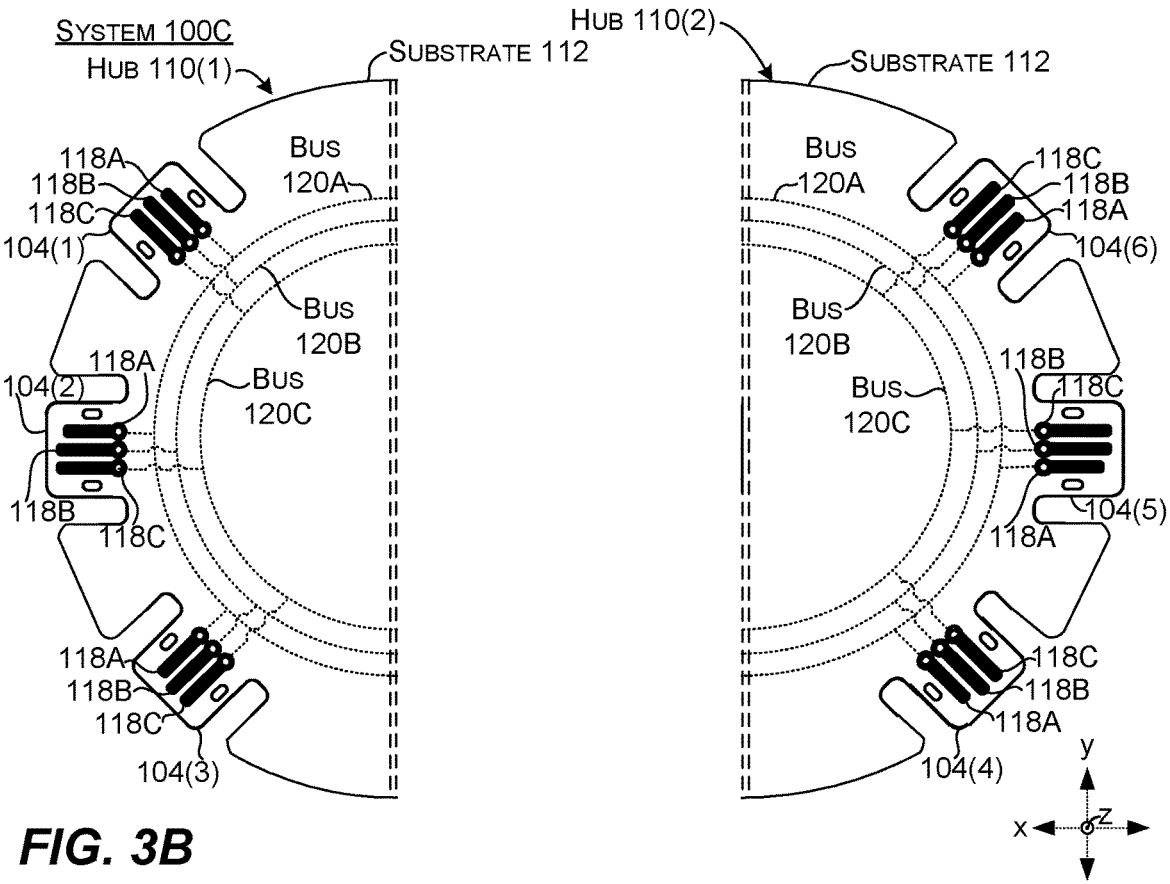

FIGS. 3A and 3B collectively illustrate another example system 100C. As used here, the suffix "C" indicates that this system may be different from systems 100A and 100B described above and/or from systems described below. For instance, the system may include different components and/or individual components that may have differences from similar components in other systems.

In this case, the substrate 112 is generally elliptical-shaped with multiple tabs 104 positioned around the periphery of the substrate. In this example, six tabs 104 are employed, but other numbers of tabs can be employed. The data contacts 118A of the six tabs 104 are electrically coupled by data bus 120A, ground contacts 118B of the six tabs 104 are electrically coupled by ground bus 120B, and power contacts 118C of the six tabs 104 are electrically coupled by power bus 120C. The hub 110 can also have one or more pre-treated zones 204 that are configured to facilitate dividing the hub into multiple distinct functional hubs. The illustrated implementation employs one pre-treated zone to which a force can be applied to promote 'designed' physical failure of the substrate 112 and the buses 120 along the pre-treated zone.

FIG. 3B shows the hub 110 of FIG. 3A divided or broken into two separate functional hubs 110(1) and 110(2). Note that the buses 120 are configured so that separation along the pre-treated zone results in the buses of each new hub connecting all of the contacts on their respective new hubs despite that the buses were 'broken' at the separating pre-treated zone. Thus, on hub 110(1) the data contacts 118A of the three tabs 104(1)-104(3) are electrically coupled by data bus 120A, ground contacts 118B of the three tabs 104(1)-104(3) are electrically coupled by ground bus 120B, and power contacts 118C of the three tabs 104(1)-104(3) are electrically coupled by power bus 120C. Similarly, on hub 110(2) the data contacts 118A of the three tabs 104(4)-104(6) are electrically coupled by data bus 120A, ground contacts 118B of the three tabs 104(4)-104(6) are electrically coupled by ground bus 120B, and power contacts 118C of the three tabs 104(4)-104(6) are electrically coupled by power bus 120C. Thus, the present implementations can provide a user configurable hub for connecting devices or dividing the hub into multiple distinct hubs that can be employed physically separated from one another.

The implementations described above relate to relatively large hubs with a relatively large number of tabs. The description now turns to a relatively small hub for connecting two devices where space constraints and/or resource usage are driving factors.

Figure 4A:
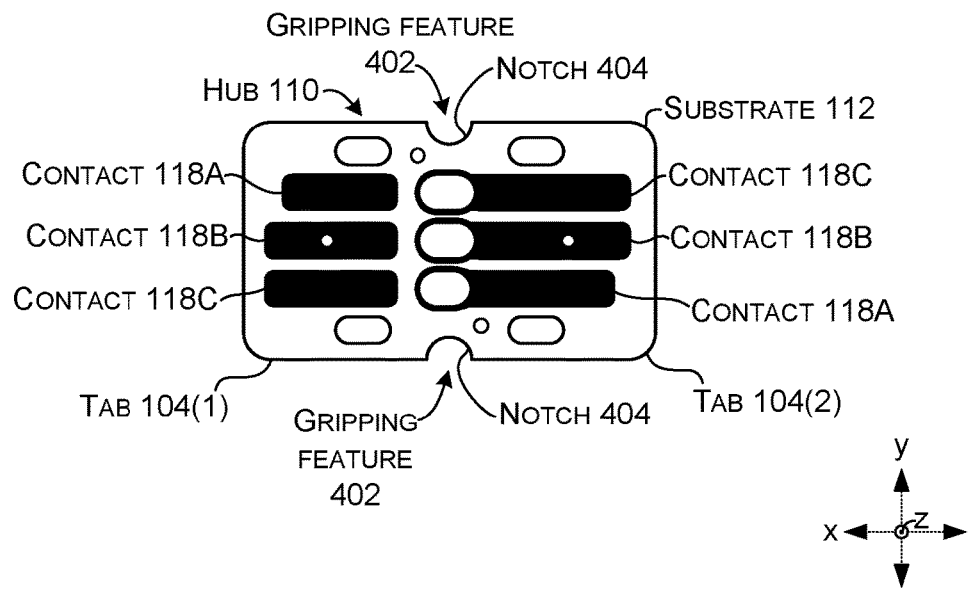
Figure 4B:
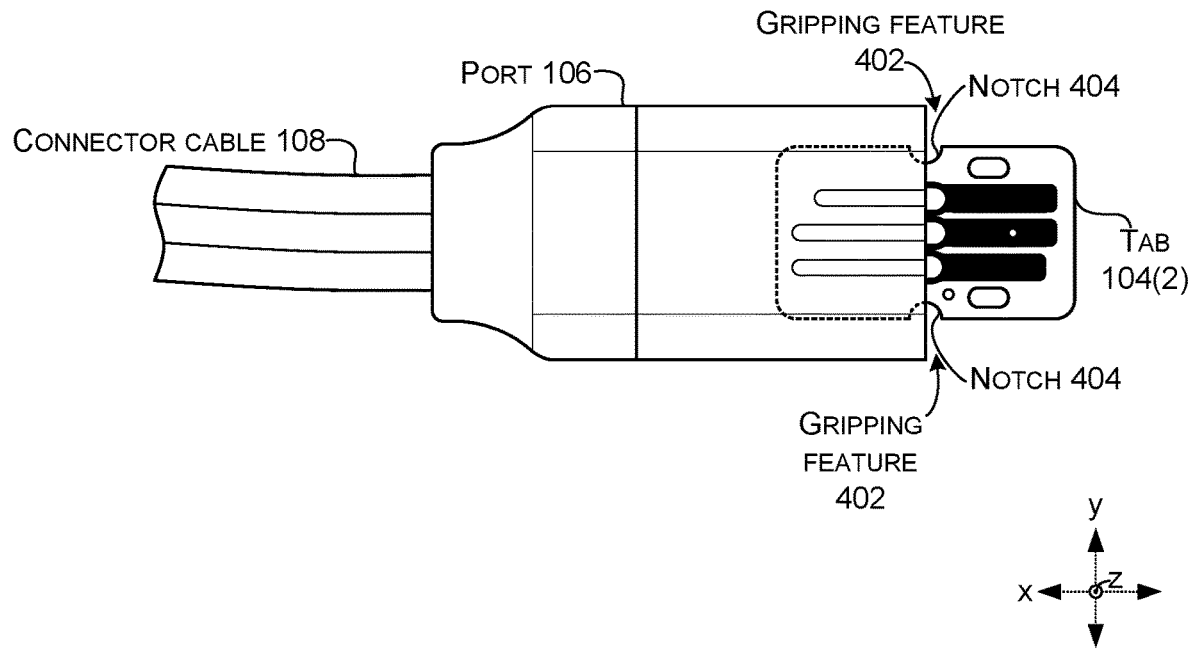

FIGS. 4A and 4B show another system 100A that includes a hub 110 that is configured to connect two devices via connector cables 108. In this case, the area of the substrate 112 is reduced to essentially the real estate occupied by two opposing tabs 104. Each tab 104 can include data contacts 118A that are electrically coupled by a data bus 120A (not specifically shown to avoid clutter on the drawing page), ground contacts 118B that are electrically coupled by ground bus 120B (not specifically shown to avoid clutter on the drawing page), and power contacts 118C that are electrically coupled by power bus 120C (not specifically shown to avoid clutter on the drawing page). Due to the diminutive size of the hub 110, the substrate 112 can include a gripping feature 402, such as a notch 404 that the user can catch with their fingernail to facilitate removing the hub from cable port 106. The notch 404 can be positioned to be at least partially exposed (e.g., not covered) when the hub 110 is installed in the port 106 of the cable 108. The notch may not be accessible when both hubs are installed in ports 106, but this is less of an issue because the user can pull on the two cables and/or ports until at least one of them detaches from the hubs 110.

The hubs 110 can be formed from various materials, such as various polymers and/or composites. The hubs can be formed utilizing various techniques, such as molding, 3D printing or other additive techniques, and/or machining or other material removal techniques. For instance, the substrate can be a monolithic single layer. The data bus, the ground bus, and the power bus, (or at least portions thereof) can be positioned over the substrate and covered with an insulative layer. Alternatively, the substrate can entail multiple layers and the data bus, the ground bus, and the power bus, (or at least portions thereof) can be positioned between the layers.

Individual elements of the hubs can be made from various materials, such as metals, plastics, and/or composites. These materials can be prepared in various ways, such as from formed sheet metals, die cast metals, machined metals, 3D printed materials, molded or 3D printed plastics, and/or molded or 3D printed composites, among others, and/or any combination of these materials and/or preparations can be employed. Conductors, such as the contacts and/or the buses can be formed/positioned using various formation techniques, such as lithographic techniques, trace deposition techniques (e.g., printing), etc.

The pre-treated zones can be incorporated into the formation process. For instance, the substrate may be formed thinner at the pre-treated zones than at adjacent areas. Alternatively, post processing can be performed to create the pre-treated zones. For instance, substrate material can be physically removed (e.g., a shallow trough could be formed in the substrate to define the pre-treated zone). Alternatively or additionally, a localized process could be performed on the pre-treated zone to weaken the substrate. For instance, a laser could be used to weaken the substrate through chemical changes, such as by decreasing the extent of crosslinking in a polymer substrate and/or by physically damaging or removing substrate. Where the buses comprise conductive traces, the conductive traces will readily separate at the pre-treated zone when the substrate separates. If conductive wires are utilized in the hub, they can be weakened at the pre-treated zones, such as by crimping or crushing with a mandrel to weaken the wire before it is integrated with the substrate and/or insulative layers.

FIGS. 5A-5C show three example substrates 112 with different example pre-treated zones 204. In this case, the pre-treated zones 204 cross the buses 120. Other pre-treated zones may cross other conductors, such as the contacts, or may not cross any conductors.

In the example configuration of FIG. 5A, the pre-treated zone 204 entails relatively large holes 502 formed in the substrate. The holes 502 can be blind holes or through holes. The holes can be formed in the substrate before or after the buses are positioned on the substrate. The holes can be arranged to define where the substrate breaks. In this case, the holes are arranged linearly and generally perpendicularly to the buses 120 (e.g., parallel to they reference axis). The holes 502 can be spaced away from the buses 120 to avoid damaging the buses until (or if) the pre-treated zone is purposely subjected to stress to break the substrate 112 along the holes 502.

FIG. 5B shows a similar configuration to FIG. 5A where the holes 502 are positioned between, but not on the buses 120. In this case, multiple smaller holes 502 can be positioned between each bus. The smaller holes can create a cleaner (e.g., less jagged break) at the pre-treated zone 204.

FIG. 5C shows an alternative configuration where the holes 502 are spaced generally continuously across the pre-treated zone 204 without regard for the location of the buses 120. To ensure the electrical integrity of the buses (e.g., avoid discontinuities), the buses 120 can include widened areas 504 (widened in the y reference direction) proximate to the pre-treated zone 204. The widened areas 504 can have a width that is greater than a diameter of the holes 502. Thus, even if holes occur at the same location as the bus, a conductive path will be maintained through the pre-treated zone 204 between the holes until such time as the user decides to split the substrate.

Various methods of manufacture, assembly, and/or use for prototyping platforms including hubs are contemplated beyond those shown above relative to FIGS. 1A-5C.

Although techniques, methods, devices, systems, etc., pertaining to prototyping platforms are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

Various examples are described above. Additional examples are described below. One example includes a hub comprising an electrically insulative substrate having generally opposing first and second major surfaces, at least four connector tabs defined by the substrate, each connector tab comprising a data contact, a power contact, and a ground contact on the substrate, a data bus electrically connecting all of the data contacts, a power bus electrically connecting all of the power contacts, and a ground bus electrically connecting all of the ground contacts and a pre-treated zone formed in the substrate through the data bus, the power bus, and the ground bus between a first pair of the at least four connector tabs and a second pair of the at least four connector tabs to allow the substrate and the data bus, the power bus, and the ground bus to be broken to physically separate the first pair from the second pair while maintaining intra-pair data connectivity, power connectivity, and ground connectivity.

Another example can include any of the above and/or below examples where the at least four connector tabs comprise the first pair that is bisected by an axis and the second pair that is bisected by the axis and wherein the pre-treated zone is orthogonal to the axis between the first pair and the second pair.

Another example can include any of the above and/or below examples where the hub further comprises a third pair that is bisected by the axis and another pre-treated zone between the second pair and the third pair.

Another example can include any of the above and/or below examples where the hub further comprises a fourth pair that is bisected by the axis and a further pre-treated zone between the third pair and the fourth pair.

Another example can include any of the above and/or below examples where the substrate is generally elliptical-shaped and the pre-treated zone divides the first pair from the second pair.

Another example can include any of the above and/or below examples where the pre-treated zone bisects the generally elliptical-shaped substrate.

Another example can include any of the above and/or below examples where the first pair comprises at least first, second, and third connector tabs on a first side of the pre-treated zone and at least fourth, fifth, and sixth connector tabs on a second side of the pre-treated zone.

Another example can include any of the above and/or below examples where the substrate is generally X-shaped and the pre-treated zone divides the first pair from the second pair.

Another example can include any of the above and/or below examples where each connector tab is physically identical.

Another example can include any of the above and/or below examples where each connector tab comprises an instance of the data contact, the power contact, and the ground contact on both of the opposing first and second major surfaces.

Another example can include any of the above and/or below examples where each connector tab is configured to be received in a cable port so that a data conductor of the cable port, a power conductor of the cable port, and a ground conductor of the cable port are automatically aligned with the instance of the data contact, the power contact, and the ground contact on the first major surface or with the instance of the data contact, the power contact, and the ground contact on the second major surface.

Another example can include any of the above and/or below examples where the data contact, the power contact, and the ground contact are positioned directly on the substrate.

Another example includes a device comprising an electrically insulative substrate having generally opposing first and second major surfaces, at least two connector tabs defined by the substrate, each connector tab comprising a data contact, a power contact, and a ground contact positioned directly on both of the first and second major surfaces of the substrate and a data bus positioned within the substrate and electrically connecting all of the data contacts, a power bus positioned within the substrate and electrically connecting all of the power contacts, and a ground bus positioned within the substrate and electrically connecting all of the ground contacts.

Another example can include any of the above and/or below examples where the substrate is generally elliptical-shaped and wherein the at least two connector tabs comprise three connector tabs positioned on a first portion of the elliptical-shaped substrate and three other connector tabs positioned on a second portion of the elliptical-shaped substrate.

Another example can include any of the above and/or below examples where the device further comprises a pre-treated zone in the substrate, the data bus, the power bus, and the ground bus that divides the first portion and the second portion.

Another example can include any of the above and/or below examples where the at least two connector tabs comprise multiple pairs of opposing connector tabs.

Another example can include any of the above and/or below examples where the multiple pairs of opposing connector tabs are arranged linearly along an axis that bisects individual pairs.

Another example can include any of the above and/or below examples where the device further comprises pre-treated zones between individual pairs of opposing connector tabs.

Another example can include any of the above and/or below examples where the substrate comprises layers, and wherein at least portions of the data bus, the ground bus, and the power bus are positioned between the layers, or wherein at least portions of the data bus, the ground bus, and the power bus are positioned between the substrate and an insulative layer positioned over the substrate.

Another example includes a device comprising an electrically insulative substrate, at least two connector tabs defined by the substrate, each connector tab comprising a data contact, a power contact, and a ground contact positioned over the substrate and a data bus positioned relative to the substrate and electrically connecting all of the data contacts, a power bus positioned relative to the substrate and electrically connecting all of the power contacts, and a ground bus positioned relative to the substrate and electrically connecting all of the ground contacts.

The invention claimed is:

1. A hub, comprising:
   an electrically insulative substrate having opposing first and second major surfaces;
   a first pair of opposing linearly arranged connector tabs and a second pair of opposing linearly arranged connector tabs, each of the connector tabs having a shape defined by the substrate and comprising an exposed data contact an exposed power contact and an exposed ground contact on the substrate;
   a data bus electrically connecting all of the data contacts, a power bus electrically connecting all of the power contacts, and a ground bus electrically connecting all of the ground contacts; and,
   a pre-treated zone of weaker substrate that is parallel to the linearly arranged first and second pairs of connector tabs and extends through the data bus, the power bus, and the ground bus between the first pair of the opposing linearly arranged connector tabs and the second pair of the opposing linearly arranged connector tabs to allow the weaker substrate, the data bus, the power bus, and the ground bus to be broken to physically separate the first pair of opposing linearly arranged connector tabs from the second pair of opposing linearly arranged connector tabs while maintaining intra-pair data connectivity, power connectivity, and ground connectivity.

2. The hub of claim 1, wherein the first pair is bisected by an axis and the second pair is bisected by the axis, and wherein the pre-treated zone of weaker substrate is orthogonal to the axis between the first pair and the second pair.

3. The hub of claim 2, further comprising a third pair that is bisected by the axis and another pre-treated zone of weaker substrate between the second pair and the third pair.

4. The hub of claim 3, further comprising a fourth pair that is bisected by the axis and a further pre-treated zone of weaker substrate between the third pair and the fourth pair.

5. The hub of claim 1, wherein the substrate is elliptical-shaped and the pre-treated zone of weaker substrate divides the first pair from the second pair.

6. The hub of claim 5, wherein the pre-treated zone of weaker substrate bisects the elliptical-shaped substrate.

7. The hub of claim 1, wherein the substrate is X-shaped and the pre-treated zone of weaker substrate divides the first pair from the second pair.

8. The hub of claim 1, wherein each connector tab is physically identical.

9. The hub of claim 8, wherein each connector tab comprises an instance of the data contact, the power contact, and the ground contact on both of the opposing first and second major surfaces.

10. The hub of claim 9, wherein each connector tab is configured to be received in a cable port so that a data conductor of the cable port, a power conductor of the cable port, and a ground conductor of the cable port are automatically aligned with the instance of the data contact, the power contact, and the ground contact on the first major surface or with the instance of the data contact, the power contact, and the ground contact on the second major surface.

11. The hub of claim 1, wherein the data contact, the power contact, and the ground contact are positioned directly on the substrate.

12. A device, comprising:
an electrically insulative substrate having opposing first and second major surfaces;
first and second pairs of linearly arranged connector tabs defined and shaped by the substrate, each connector tab comprising an exposed data contact, an exposed power contact, and an exposed ground contact positioned on the substrate; and,
a data bus positioned within the substrate and electrically connecting all of the data contacts, a power bus positioned within the substrate and electrically connecting all of the power contacts, a ground bus positioned within the substrate and electrically connecting all of the ground contacts, and a pre-treated zone of weakened substrate that extends across the substrate parallel to and between the first and second pairs of linearly arranged connector tabs and intersects the data bus, the power bus, and the ground bus to allow the device to be broken along the pre-treated zone of weakened substrate to create a first functional devices that includes the first pair of linearly arranged connector tabs and a second functional device that includes the second pair of linearly arranged connector tabs.

13. The device of claim 12, wherein the substrate is elliptical-shaped.

14. The device of claim 13, wherein the data bus, the power bus, and the ground bus are weakened at the pre-treated zone.

15. The device of claim 12, further comprising a third pair of linearly arranged connector tabs.

16. The device of claim 15, wherein the first, second, and third pairs of linearly arranged connector tabs are arranged linearly along an axis that bisects individual pairs.

17. The device of claim 12, wherein the substrate comprises layers and, wherein at least portions of the data bus, the ground bus, and the power bus are positioned between the layers, or wherein at least portions of the data bus, the ground bus, and the power bus are positioned between the substrate and an insulative layer positioned over the substrate.

18. A device, comprising:
an electrically insulative substrate;
at least two pairs of linearly arranged connector tabs having shapes defined by the substrate, each connector tab comprising an exposed data contact, an exposed power contact, and an exposed ground contact positioned over the substrate; and,
a data bus positioned relative to the substrate and electrically connecting all of the data contacts, a power bus positioned relative to the substrate and electrically connecting all of the power contacts, and a ground bus positioned relative to the substrate and electrically connecting all of the ground contacts, and a pre-treated zone of weaker substrate that extends across the substrate parallel to the linearly arranged pairs of connector tabs and thereby separating members of individual pairs of linearly arranged connector tabs from one another to allow the device to be broken along the pre-treated zone into two functional devices that each include one of the pairs of linearly arranged connector tabs.

19. The device of claim 18, wherein the data contact, the power contact, and the ground contact are positioned directly on the substrate.

20. The device of claim 18, wherein the pre-treated zone of weaker substrate comprises an array of multiple holes formed through the substrate.

\* \* \* \* \*